US009224849B2

(12) United States Patent
Colinge et al.

(10) Patent No.: US 9,224,849 B2
(45) Date of Patent: Dec. 29, 2015

(54) TRANSISTORS WITH WRAPPED-AROUND GATES AND METHODS FOR FORMING THE SAME

(71) Applicant: Taiwan Semiconductor Manufacturing Company, Ltd., Hsin-Chu (TW)

(72) Inventors: Jean-Pierre Colinge, Hsin-Chu (TW); Kuo-Cheng Ching, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 244 days.

(21) Appl. No.: 13/729,581

(22) Filed: Dec. 28, 2012

(65) Prior Publication Data

US 2014/0183643 A1 Jul. 3, 2014

(51) Int. Cl.
| | |
|---|---|
| *H01L 27/088* | (2006.01) |
| *H01L 29/78* | (2006.01) |
| *H01L 21/762* | (2006.01) |
| *H01L 21/8234* | (2006.01) |
| *H01L 29/423* | (2006.01) |
| *H01L 29/786* | (2006.01) |

(52) U.S. Cl.
CPC .......... *H01L 29/78* (2013.01); *H01L 21/76224* (2013.01); *H01L 21/823431* (2013.01); *H01L 27/0886* (2013.01); *H01L 29/42392* (2013.01); *H01L 29/785* (2013.01); *H01L 29/78696* (2013.01)

(58) Field of Classification Search
CPC ................. H01L 21/76224; H01L 21/823431; H01L 27/0886; H01L 29/42392; H01L 29/78; H01L 29/785; H01L 29/78696
USPC .......................................... 257/368, 401, 411
See application file for complete search history.

(56) References Cited

U.S. PATENT DOCUMENTS

| | | | | |
|---|---|---|---|---|
| 6,359,311 | B1 * | 3/2002 | Colinge et al. | 257/347 |
| 7,109,516 | B2 * | 9/2006 | Langdo et al. | 257/19 |
| 7,241,653 | B2 * | 7/2007 | Hareland et al. | 438/199 |
| 7,259,425 | B2 * | 8/2007 | An et al. | 257/341 |
| 7,456,476 | B2 * | 11/2008 | Hareland et al. | 257/349 |
| 7,508,031 | B2 * | 3/2009 | Liu et al. | 257/331 |
| 7,820,513 | B2 * | 10/2010 | Hareland et al. | 438/283 |
| 7,898,041 | B2 * | 3/2011 | Radosavljevic et al. | 257/401 |

(Continued)

FOREIGN PATENT DOCUMENTS

| | | |
|---|---|---|
| DE | 112006000241 | 1/2010 |
| DE | 102013103057 | 10/2013 |

OTHER PUBLICATIONS

Moon et al., Silicon Nanowire All-Around Gate MOSFETs Built on a Bulk Substrate by All Plasma-Etching Routes, IEEE Electron Device Letters, vol. 32, No. 4, 2011, pp. 452-454.*

(Continued)

*Primary Examiner* — Earl Taylor
(74) *Attorney, Agent, or Firm* — Slater & Matsil, L.L.P.

(57) ABSTRACT

A device includes a substrate, a semiconductor strip over the substrate, a gate dielectric wrapping around the semiconductor strip, and a gate electrode wrapping around the gate dielectric. A dielectric region is overlapped by the semiconductor strip. The semiconductor strip and the dielectric region are spaced apart from each other by a bottom portion of the gate dielectric and a bottom portion of the gate electrode.

20 Claims, 14 Drawing Sheets

(56) References Cited

U.S. PATENT DOCUMENTS

| | | | |
|---|---|---|---|
| 8,067,818 B2* | 11/2011 | Shah et al. | 257/618 |
| 8,273,626 B2* | 9/2012 | Hareland et al. | 438/283 |
| 8,405,164 B2* | 3/2013 | Hareland et al. | 257/401 |
| 8,466,490 B2* | 6/2013 | Liu et al. | 257/139 |
| 8,823,059 B2* | 9/2014 | Dewey et al. | 257/192 |
| 8,969,179 B2* | 3/2015 | Gotsmann et al. | 438/478 |
| 2004/0108523 A1* | 6/2004 | Chen et al. | 257/202 |
| 2004/0108559 A1* | 6/2004 | Sugii et al. | 257/411 |
| 2004/0166642 A1* | 8/2004 | Chen et al. | 438/284 |
| 2005/0121706 A1* | 6/2005 | Chen et al. | 257/288 |
| 2005/0127466 A1* | 6/2005 | Furukawa et al. | 257/499 |
| 2006/0172497 A1* | 8/2006 | Hareland et al. | 438/286 |
| 2006/0189043 A1* | 8/2006 | Schulz | 438/142 |
| 2006/0240622 A1* | 10/2006 | Lee et al. | 438/257 |
| 2007/0120156 A1* | 5/2007 | Liu et al. | 257/288 |
| 2007/0241414 A1* | 10/2007 | Narihiro | 257/401 |
| 2008/0017934 A1* | 1/2008 | Kim et al. | 257/401 |
| 2008/0258207 A1* | 10/2008 | Radosavljevic et al. | 257/327 |
| 2009/0008705 A1 | 1/2009 | Zhu et al. | |
| 2009/0061572 A1* | 3/2009 | Hareland et al. | 438/157 |
| 2010/0059807 A1* | 3/2010 | Cho et al. | 257/306 |
| 2010/0193770 A1* | 8/2010 | Bangsaruntip et al. | 257/24 |
| 2010/0252801 A1* | 10/2010 | Sekaric et al. | 257/9 |
| 2013/0228751 A1* | 9/2013 | Gotsmann et al. | 257/24 |
| 2013/0270512 A1* | 10/2013 | Radosavljevic et al. | 257/9 |
| 2013/0270652 A1* | 10/2013 | Liaw | 257/401 |
| 2014/0001441 A1* | 1/2014 | Kim et al. | 257/29 |
| 2014/0054724 A1* | 2/2014 | Ching et al. | 257/410 |
| 2014/0175561 A1* | 6/2014 | Colinge et al. | 257/401 |
| 2014/0183643 A1* | 7/2014 | Colinge et al. | 257/368 |
| 2014/0197456 A1* | 7/2014 | Wang et al. | 257/192 |
| 2014/0203334 A1* | 7/2014 | Colinge et al. | 257/288 |
| 2014/0273363 A1* | 9/2014 | Chiu et al. | 438/165 |
| 2014/0332852 A1* | 11/2014 | Dewey et al. | 257/192 |
| 2014/0353731 A1* | 12/2014 | Colinge et al. | 257/288 |
| 2015/0008489 A1* | 1/2015 | Ching et al. | 257/288 |
| 2015/0021697 A1* | 1/2015 | Colinge et al. | 257/368 |

OTHER PUBLICATIONS

Bangsaruntip, S., et al., "High Performance and Highly Uniform Gate-All-Around Silicon Nanowire MOSFETs with Wire Size Dependent Scaling," 2009, IEEE, pp. 297-300.

Bernard, E., et al., "First Internal Spacers' Introduction in Record High $I_{ON}/I_{OFF}$ TiN/HfO$_2$ Gate Multichannel MOSFET Satisfying Both High-Performance and Low Standby Power Requirements," IEEE Electron Device Letters, vol. 30, No. 2, Feb. 2009, pp. 148-151.

Ferain, I., et al., "Multigate transistors as the future of classical metal-oxide-semiconductor field-effect transistrors," Nature, vol. 479, Nov. 17, 2011, pp. 2-8.

Han, J.-W., et al., "Gate-All-Around Silicon Nanowire MOSFETs on Bulk Substrate," FB4-4, pp. 648-649.

Kuhn, K.J., et al., "Considerations for Ultimate CMOS Scaling," IEEE Transactions on Electron Devices, vol. 59, No. 7, Jul. 2012, pp. 1813-1828.

Monfray, S., et al., "50nm—Gate All Around (GAA)—Silicon on Nothing (SON)—Devices: A Simple Way to Co-integration of GAA Transistors within bulk MOSFET process," 2002 Symposium on VLSI Technology Digest of Technical Papers, IEEE, pp. 108-109.

Yeo, K.H., et al., "Gate-All-Around (GAA) Twin Silicon Nanowire MOSFET (TSNWFET) with 15 nm Length Gate and 4 nm Radius Nanowires," 2006, IEEE, 4 pgs.

Dana et al., "Raman and TEM studies of Ge nanocrystal formation in SiOx:Ge/SiOx multilayers", Phys. Stat. Solid (c) 4, No. 2, pp. 288-291 (2007). http://dx.doi.org/10.1002/pssc.200673233. Jul. 2006.

Blacic, James D. et al., "Plasticity and Hydrolytic Weakening of Quartz Single Crystals," Journal of Geophysical Research, vol. 89, No. B6, pp. 4223-4239, Jun. 10, 1984.

Ojovan, M.I. et al., "Topologically disordered systems at the glass transition," White Rose Research Online, White Rose university consortium, Universities of Leeds, Sheffield & York, http://eprints.whiterose.ac.uk/1958, Journal of Physics: Condensed Matter, 18 (50), pp. 11507-11520. Dec. 2006.

* cited by examiner

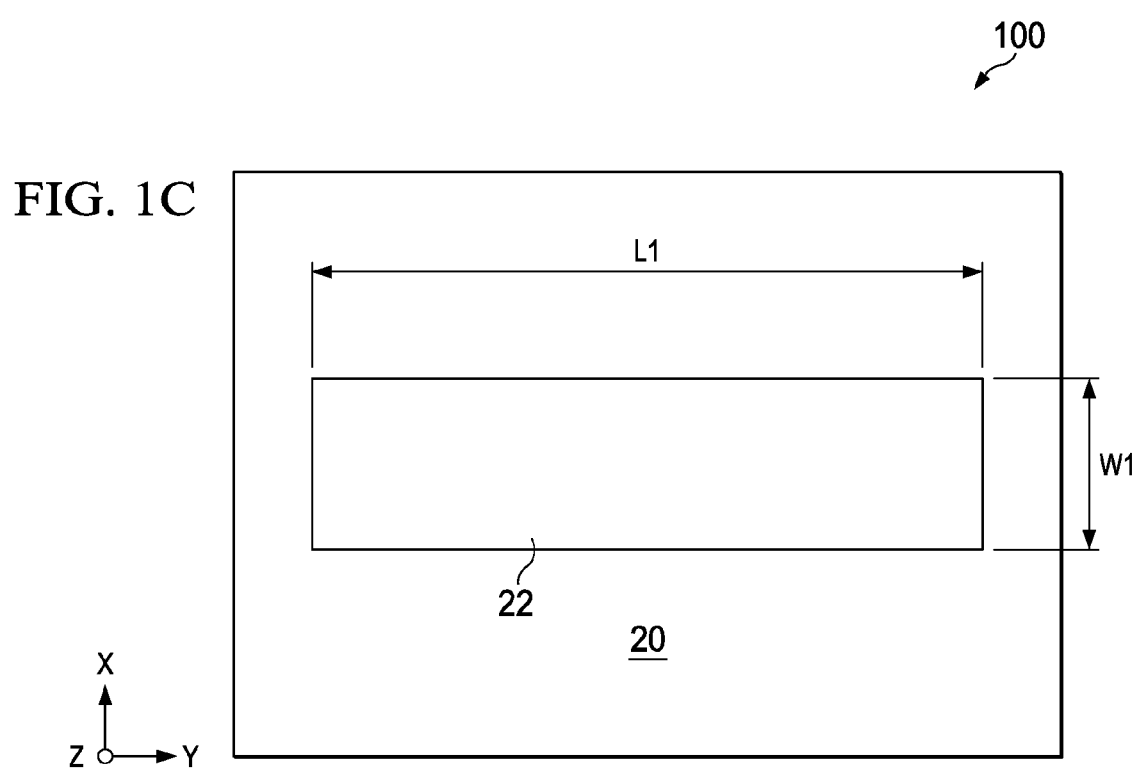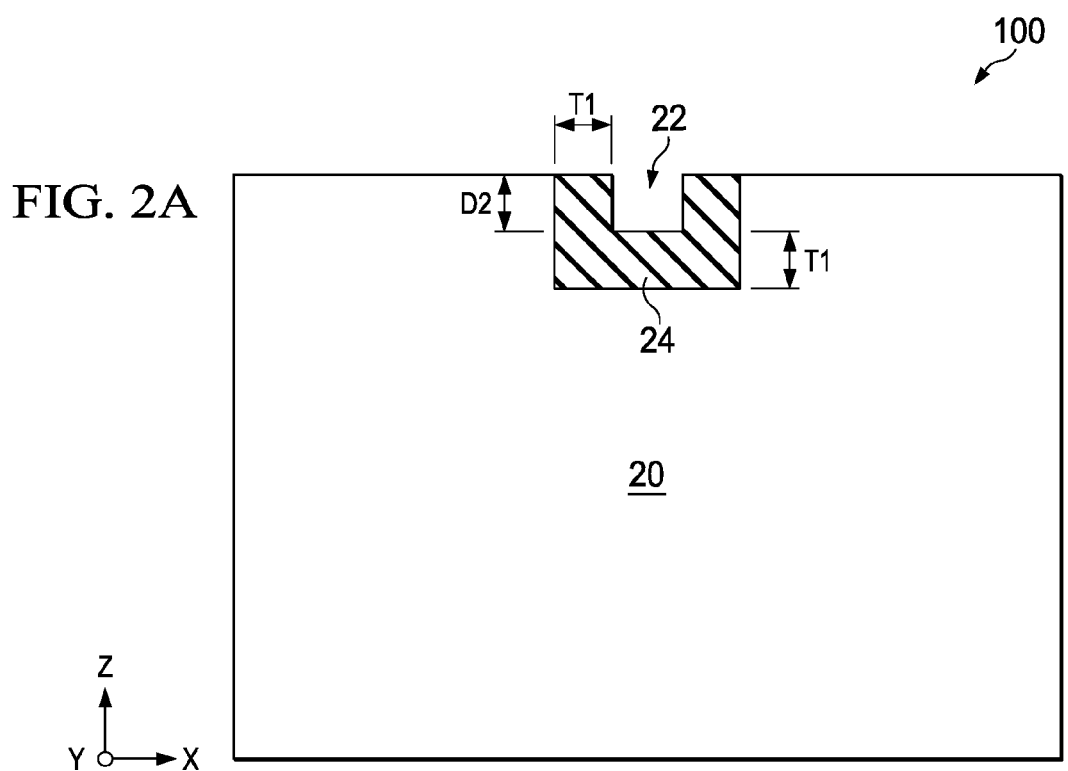

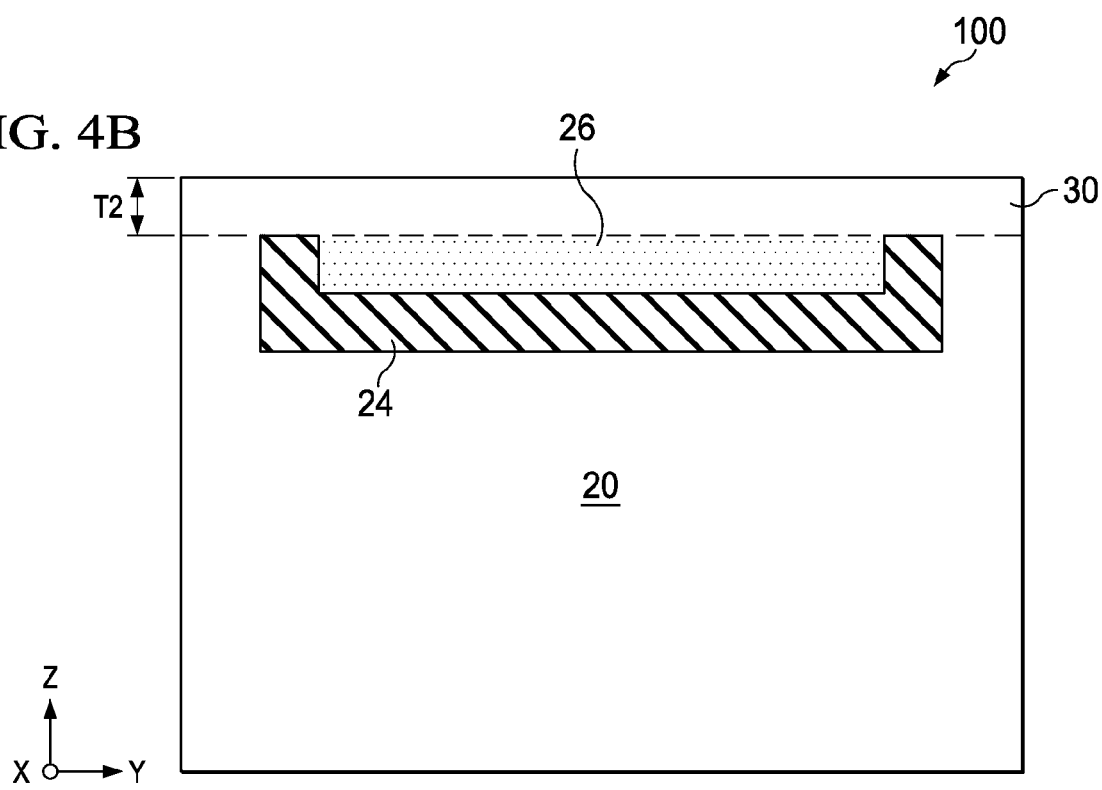
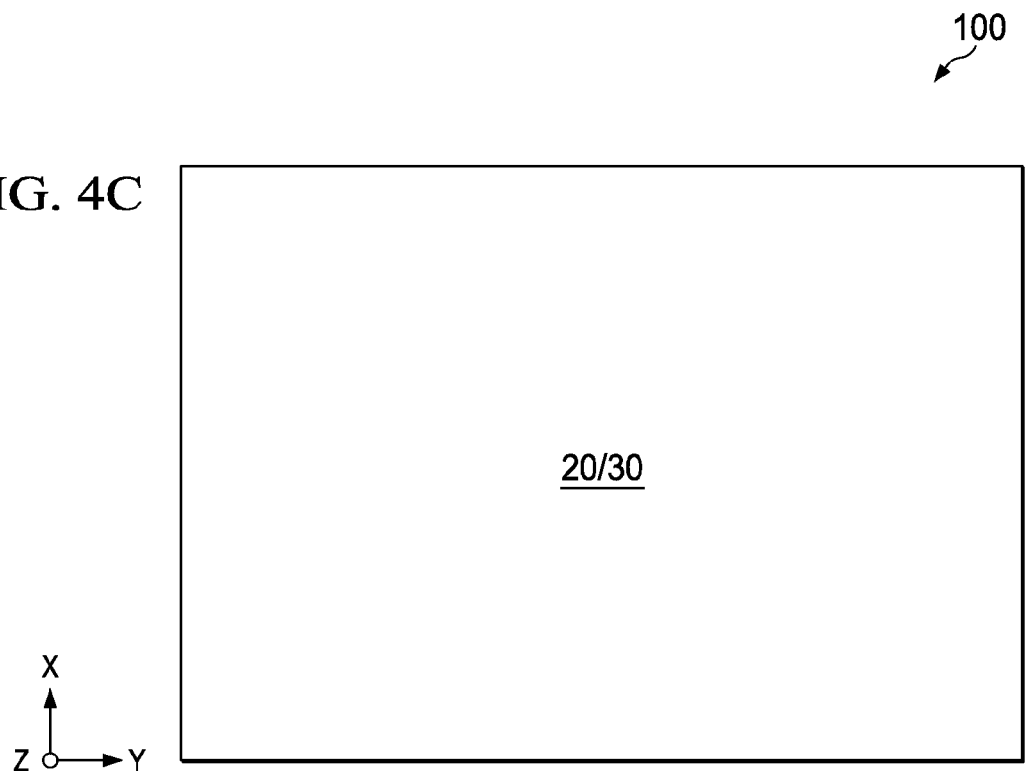

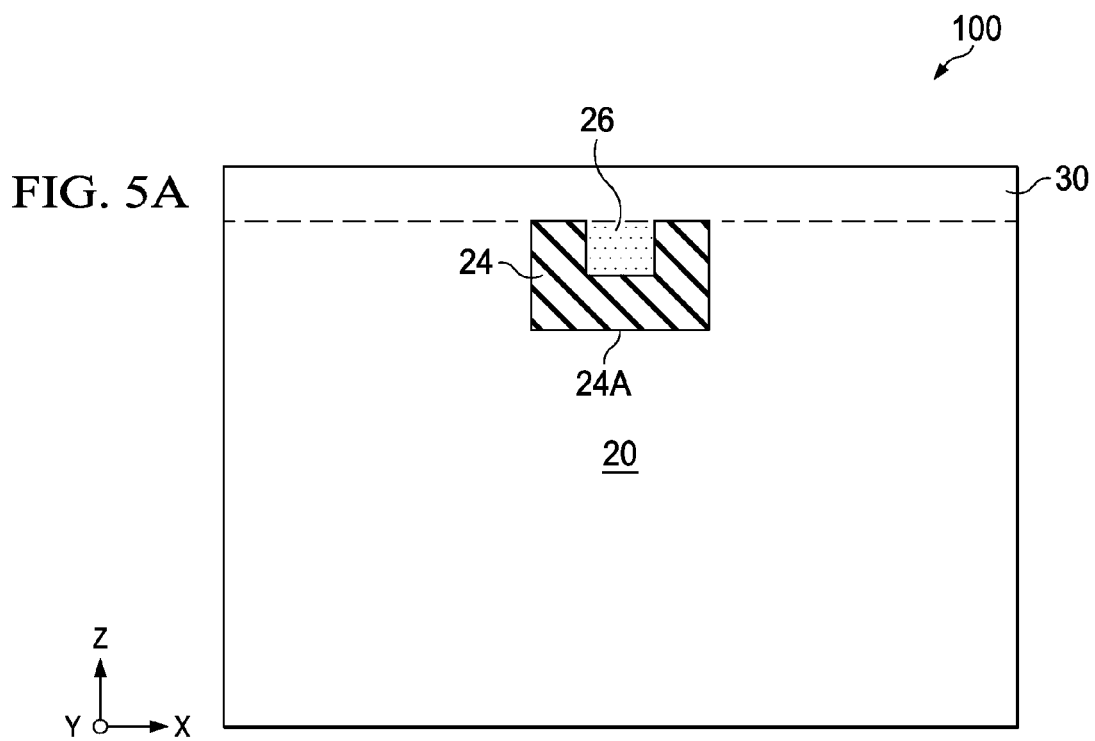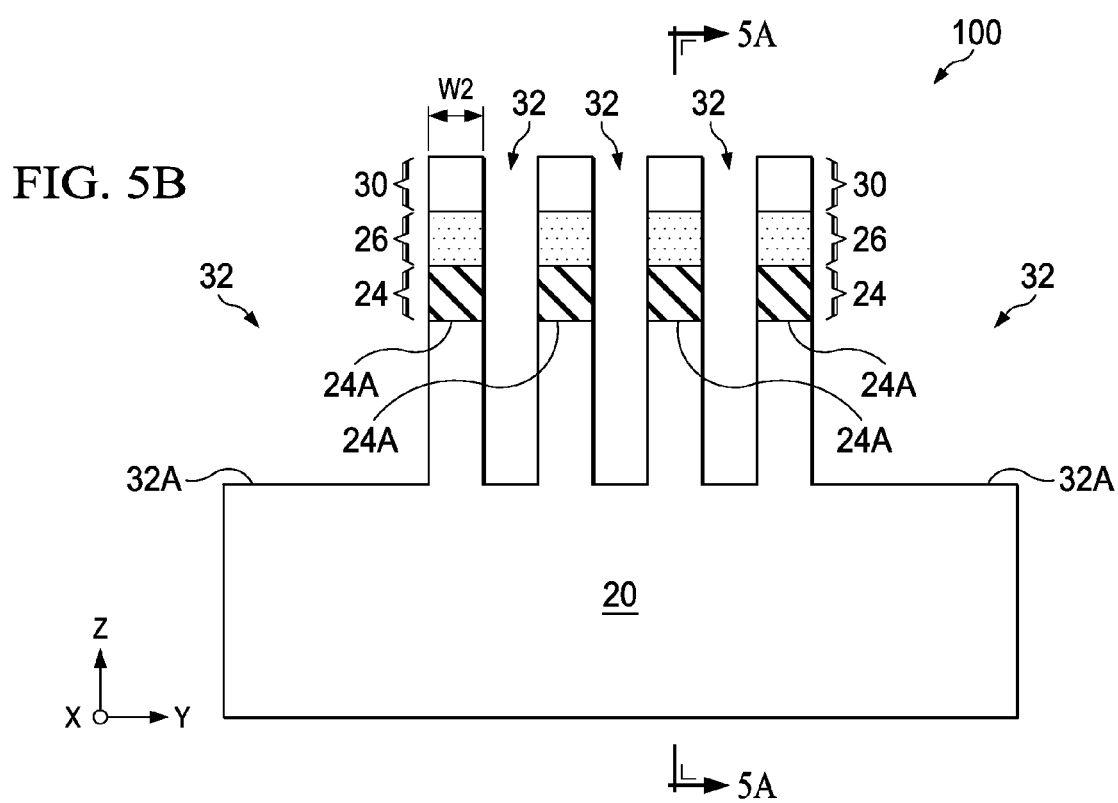

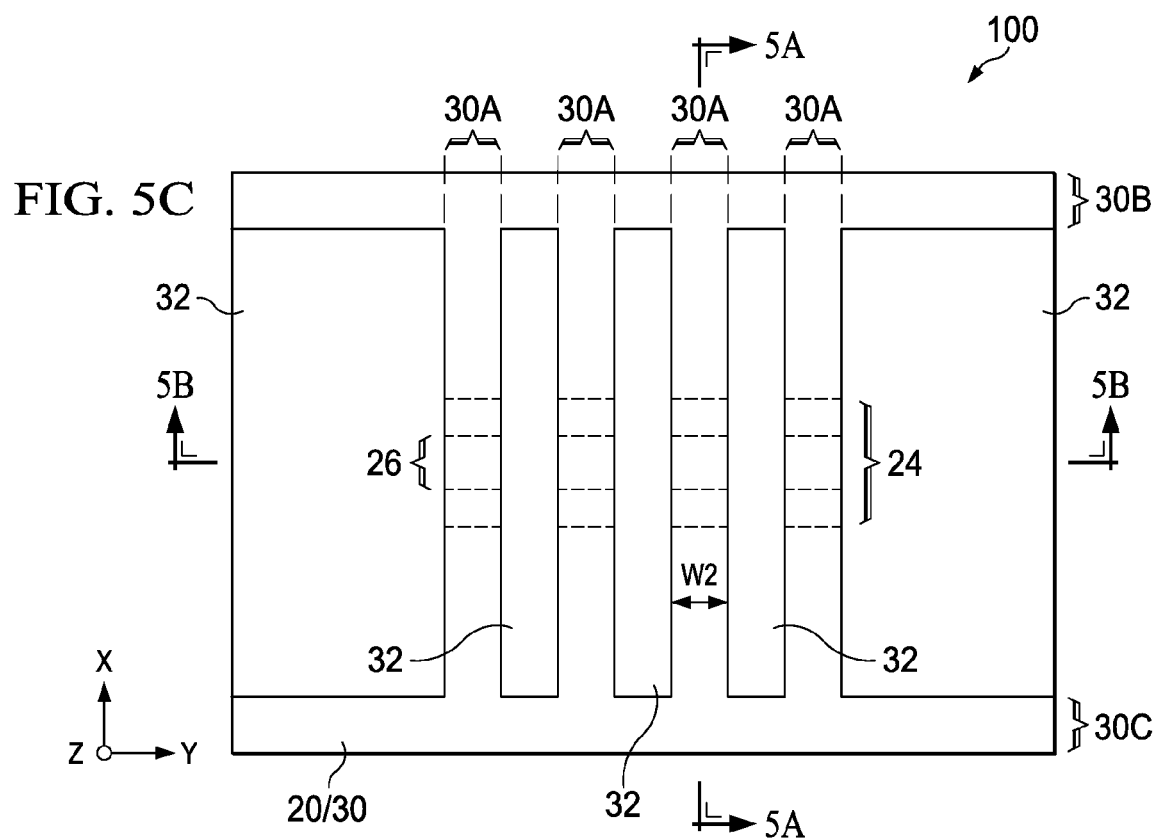
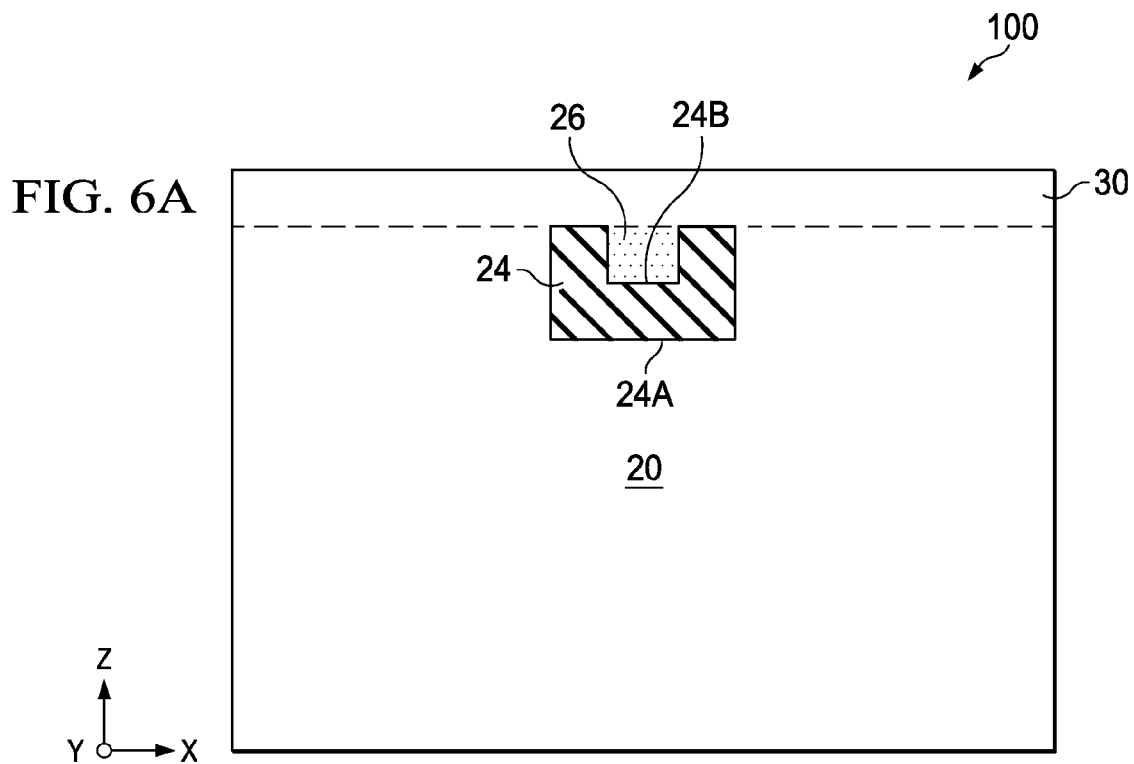

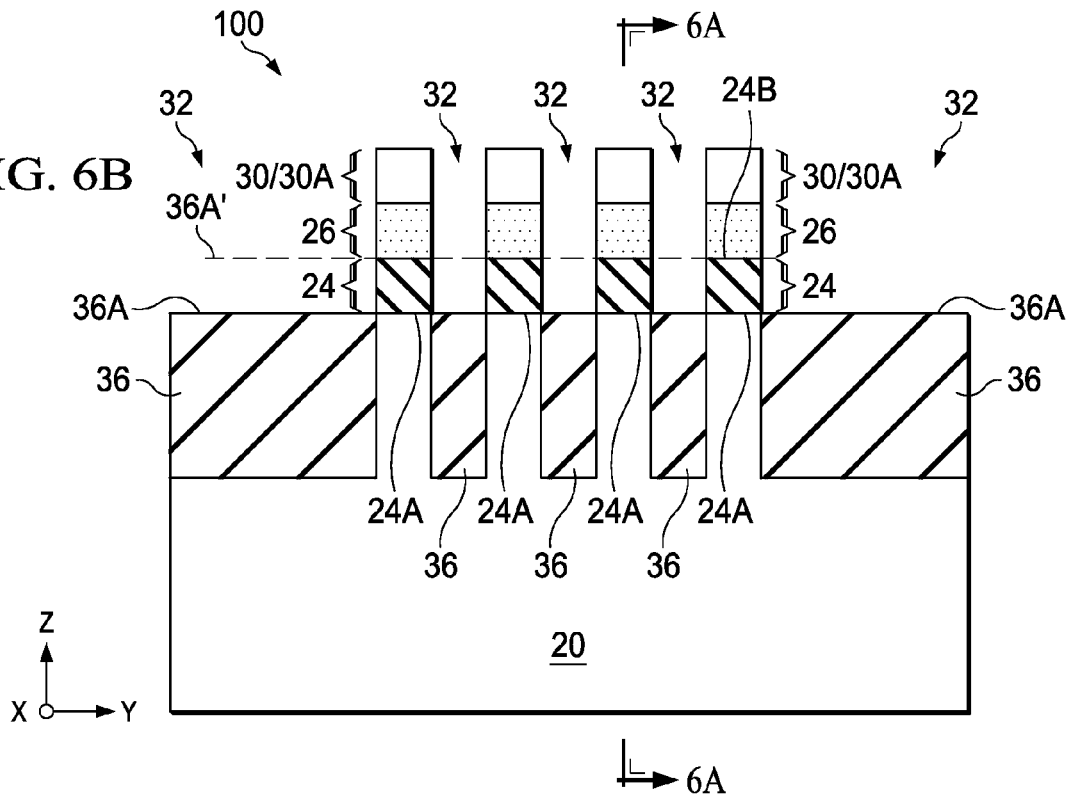
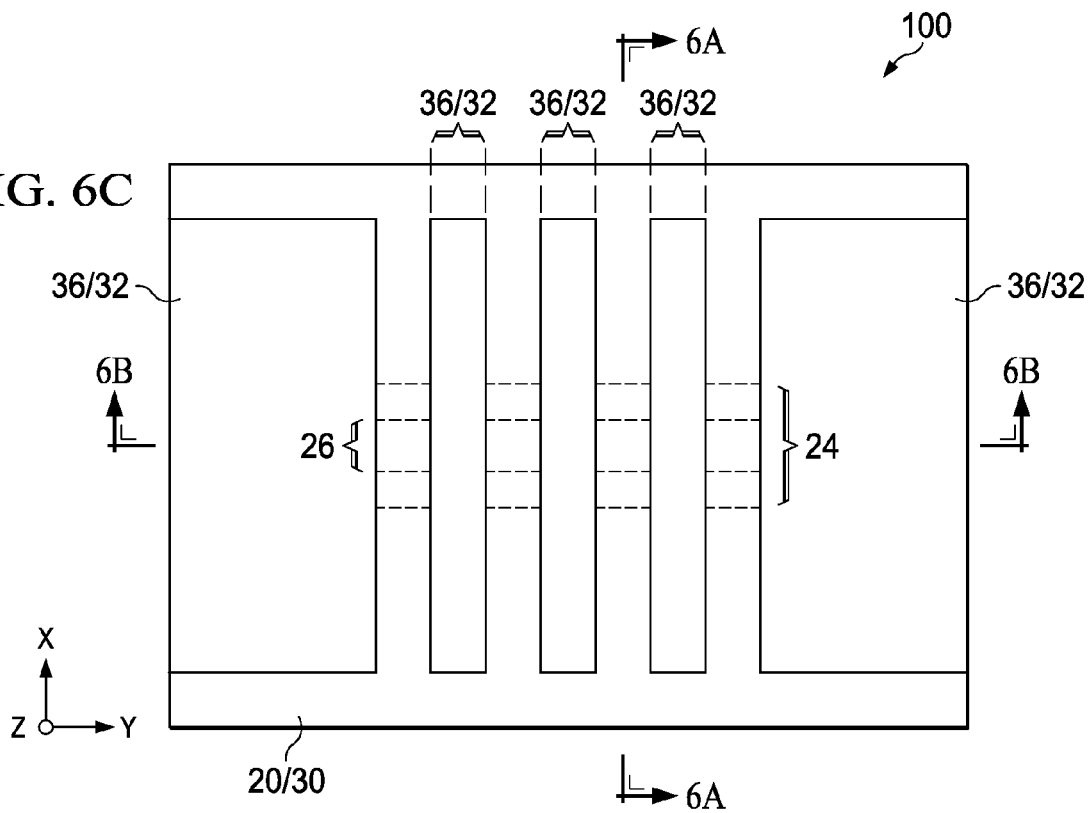

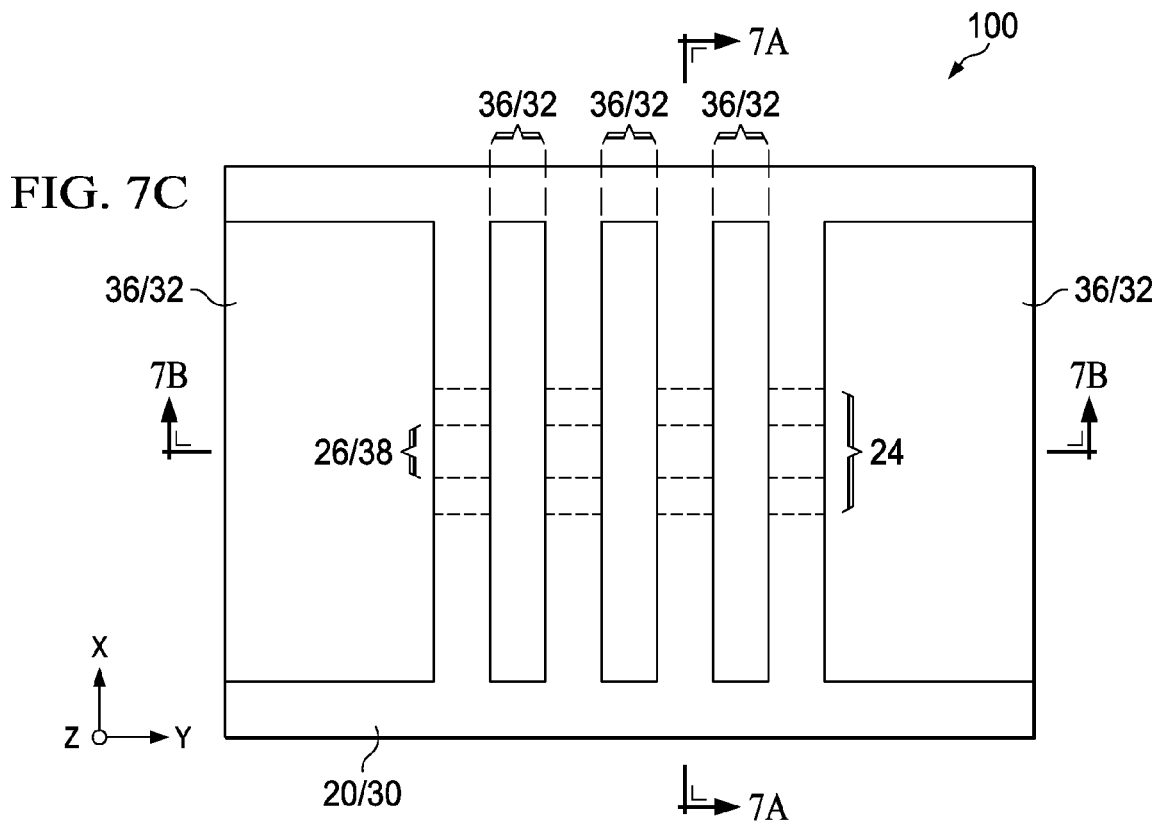
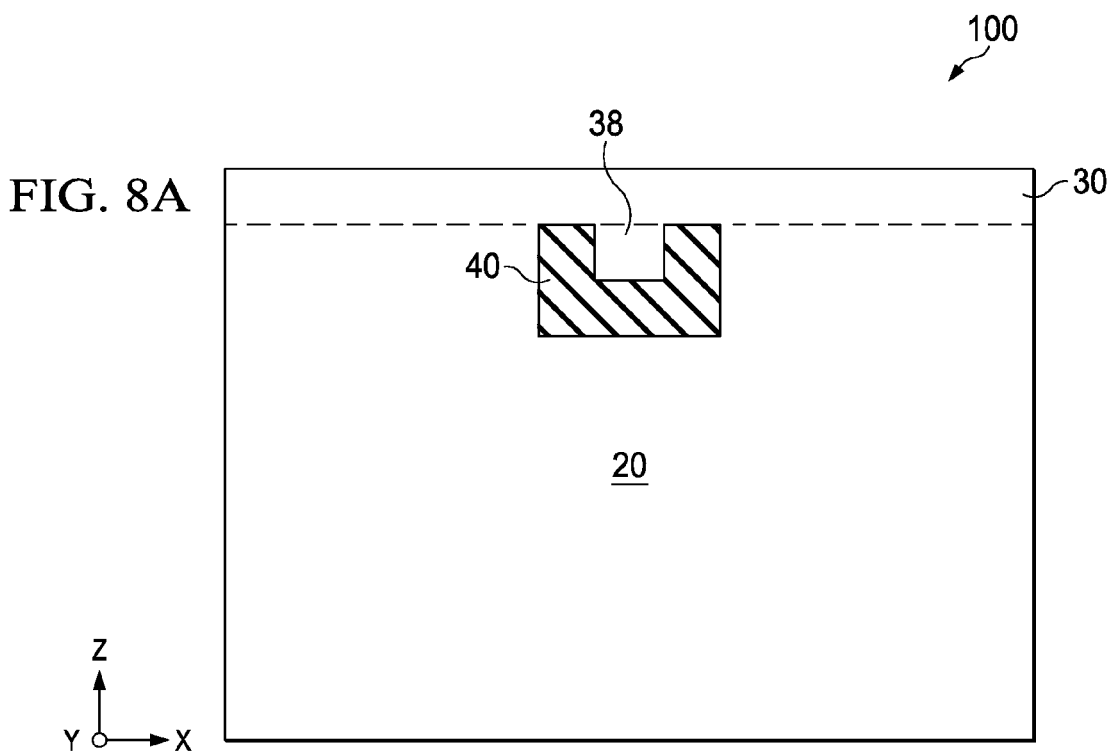

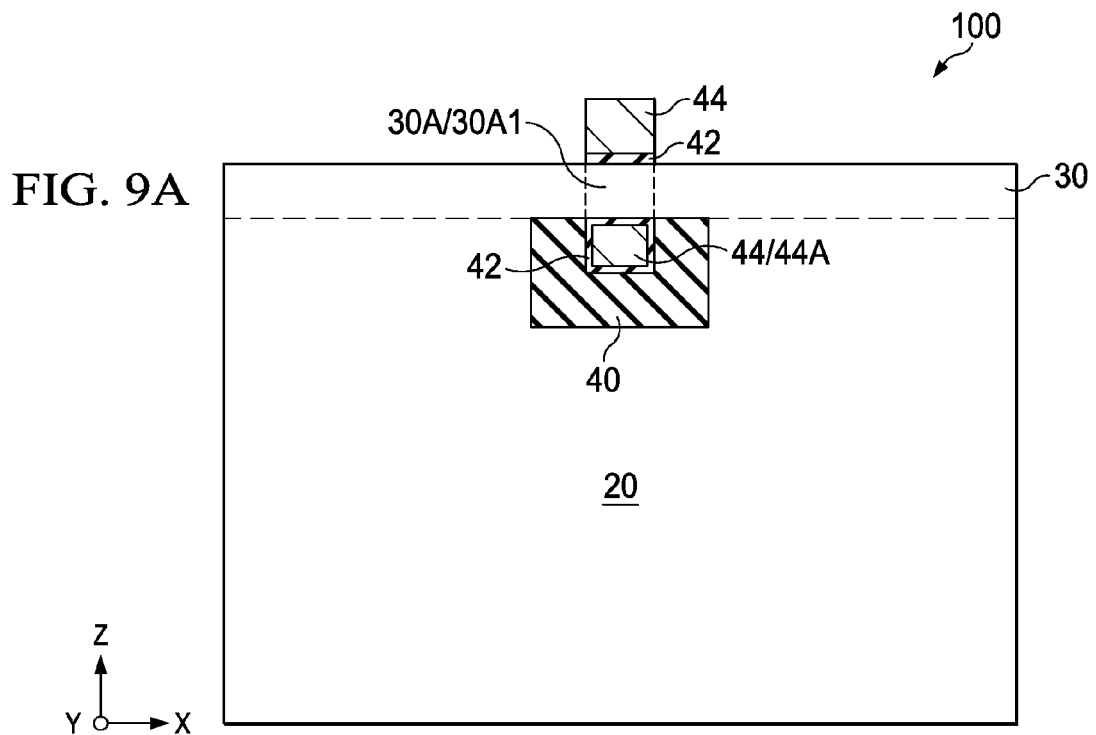
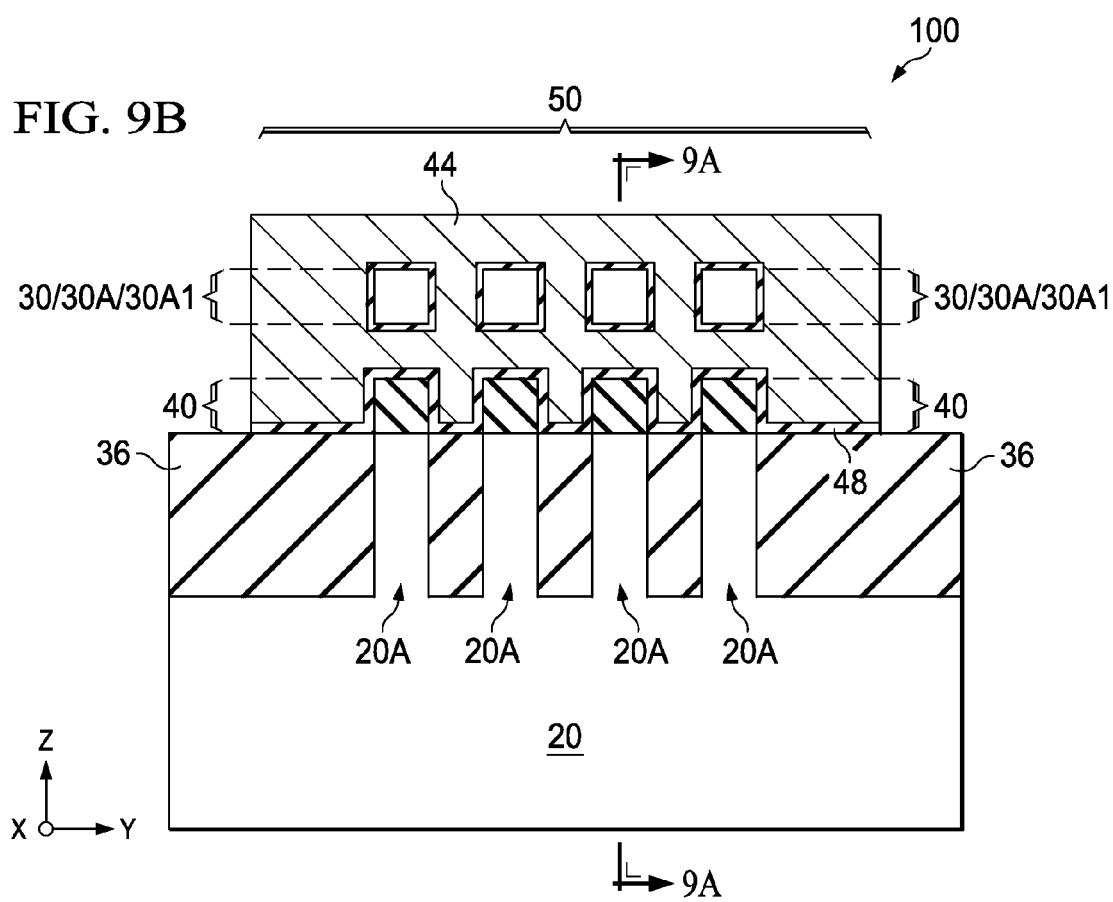

US 9,224,849 B2

TRANSISTORS WITH WRAPPED-AROUND GATES AND METHODS FOR FORMING THE SAME

BACKGROUND

Transistors are key components of modern integrated circuits. To satisfy the requirements of increasingly faster speed, the drive currents of transistors need to be increasingly greater. To achieve this increase in performance, the gate lengths of transistors are constantly being scaled down. Scaling down the gate lengths leads to undesirable effects known as "short-channel effects," in which the control of current flow by the gates is compromised. Among the short-channel effects are the Drain-Induced Barrier Lowering (DIBL) and the degradation of sub-threshold slope, both of which result in the degradation in the performance of transistors.

The use of a multi-gate transistor architecture may help the relief of short-channel effects. Fin Field-Effect Transistors (FinFET) were thus developed. To further increase electrostatic control of the channels, and, therefore, to reduce short-channel effects, transistors having wrapped-around gates were also developed, wherein the respective transistors are also referred to as gate-around transistors. A gate-around transistor, in addition to having gate portions on the top surface and sidewalls of a gate strip, also includes a gate portion underneath the semiconductor strip. This configuration, in which the gate electrode wraps around all sides of the channel, delivers a good electrostatic control of the channel, and hence, reduced short-channel effects.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1A through 9C are cross-sectional views and top views of intermediate stages in the manufacturing of a transistor having a wrapped-around gate in accordance with some exemplary embodiments.

DETAILED DESCRIPTION OF ILLUSTRATIVE EMBODIMENTS

The making and using of the embodiments of the present disclosure are discussed in detail below. It should be appreciated, however, that the embodiments provide many applicable inventive concepts that can be embodied in a wide variety of specific contexts. The specific embodiments discussed are illustrative, and do not limit the scope of the present disclosure.

A Metal Oxide Semiconductor Field Effect Transistor (MOSFET) having a wrapped-around gates and the method of forming the same are provided in accordance with various exemplary embodiments. The intermediate stages of forming the MOSFET, which are also referred to as gate-around MOSFETs, are illustrated. The variations and the operation of the embodiments are discussed. Throughout the various views and illustrative embodiments, like reference numbers are used to designate like elements.

FIGS. 1A through 9C are cross-sectional views and top views of intermediate stages in the manufacturing of gate-around Fin Field-Effect Transistors (FinFETs) in accordance with some exemplary embodiments. Each of the figures are referenced with one of letters "A," "B," and "C," wherein all figures with the numbers ending with letter "A" are obtained from a same plane (X-Z plane) of a respective wafer 100, on which the gate-around MOSFET is formed. All figures with the numbers ending with letter "B" are obtained from a same plane (Y-Z plane) of wafer 100. All figures with the numbers ending with letter "C" are obtained from a same plane (X-Y plane) of wafer 100. The X-Z plane, the Y-Z plane, and the X-Y plane are perpendicular to each other. Also, figures whose names end with letters "A" and "B" are cross-sectional views of wafer 100, and figures whose name end with letters "C" are top views of wafer 100.

Figure 1A:
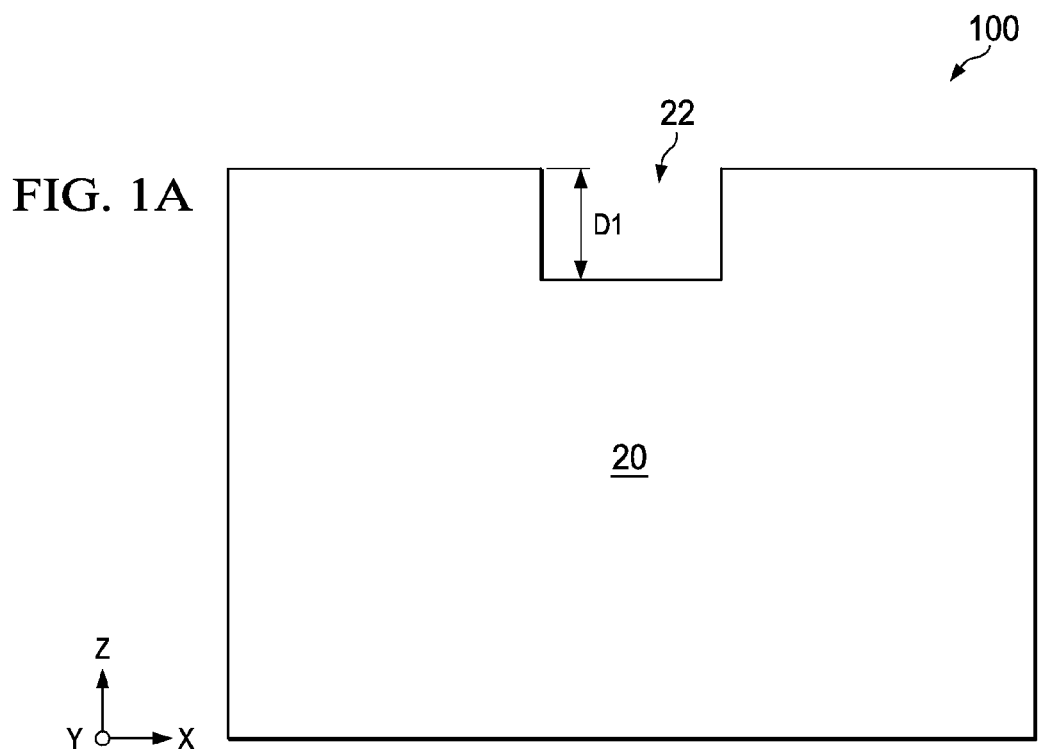
Figure 1B:
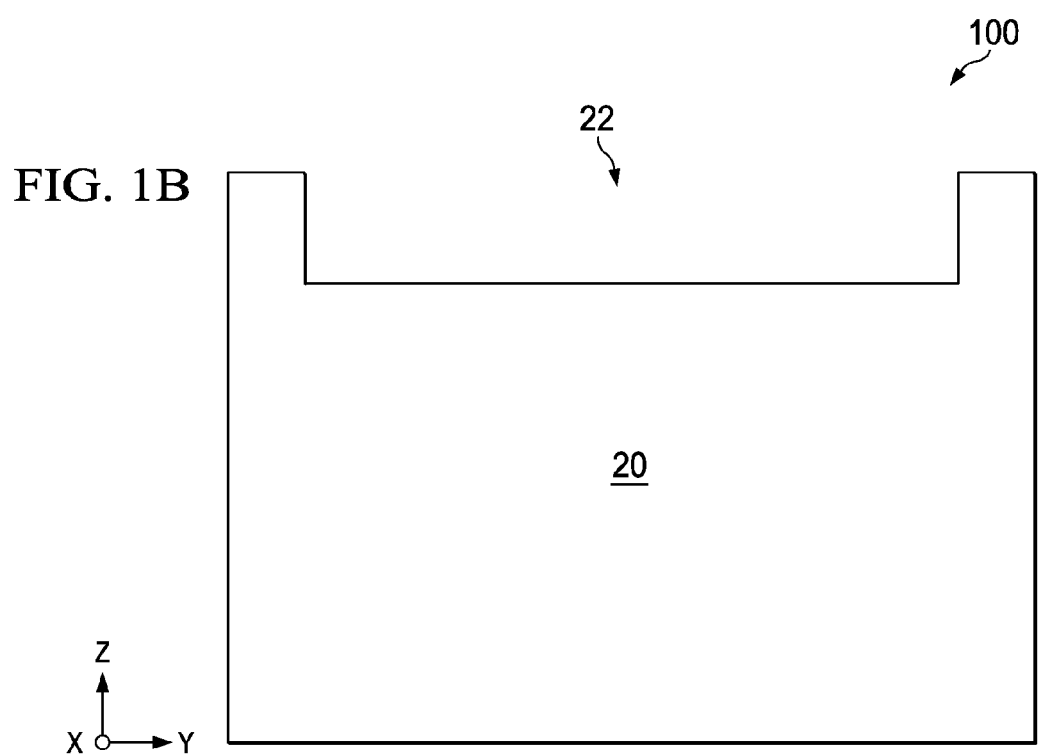

FIGS. 1A, 1B, and 1C illustrate the formation of trench 22 in substrate 20. Substrate 20 may be semiconductor substrate, which may be, for example, a silicon substrate, a silicon germanium substrate, or a substrate formed of other semiconductor materials. In some embodiments, substrate 20 is a bulk substrate. Alternatively, substrate 20 may be a Semiconductor-on-Insulator (SOI) substrate. Substrate 20 may be doped with a p-type or an n-type impurity.

Trench 22 may be formed, for example, through anisotropic etching. In some exemplary embodiments, depth D1 (FIG. 1A) of trench 22 is between about 8 nm and about 40 nm, width W1 (FIG. 1C) of trench 22 may be between about 8 nm and about 40 nm, and/or length L1 (FIG. 1C) of trench 22 may be between about 10 nm and about several hundred nanometers. It is appreciated that the values recited throughout the description are merely examples, and may be changed to different values. In the illustrated embodiments, the lengthwise direction of trench 22 is in the Y direction.

Figure 2B:
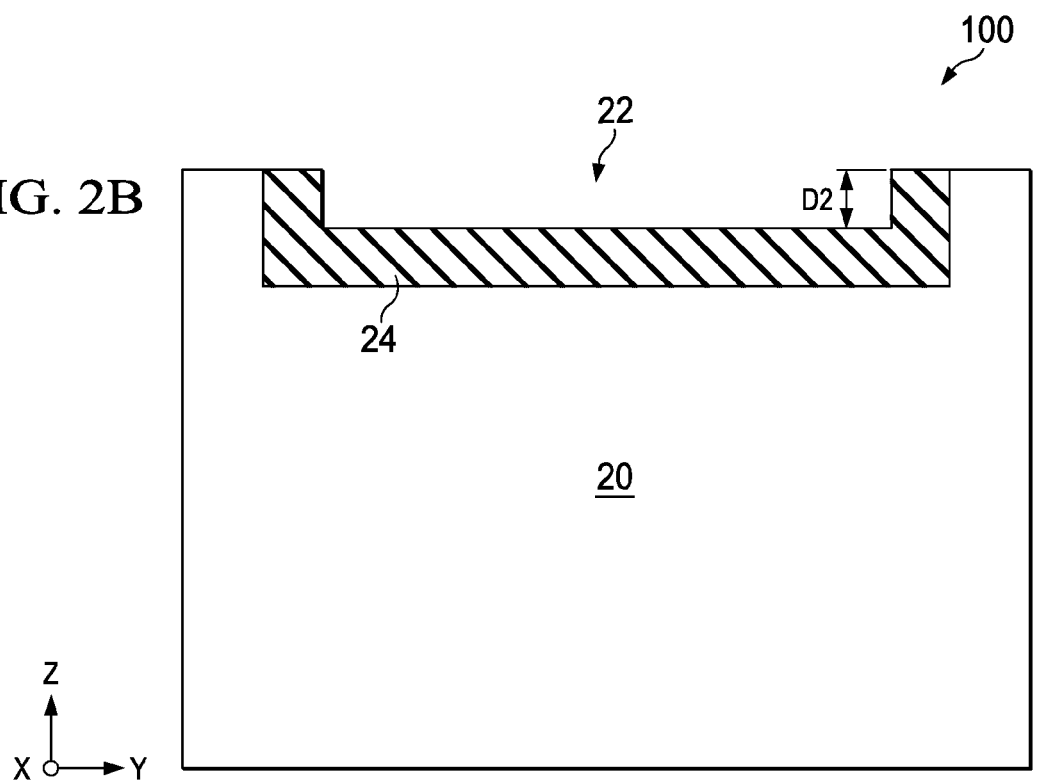
Figure 2C:
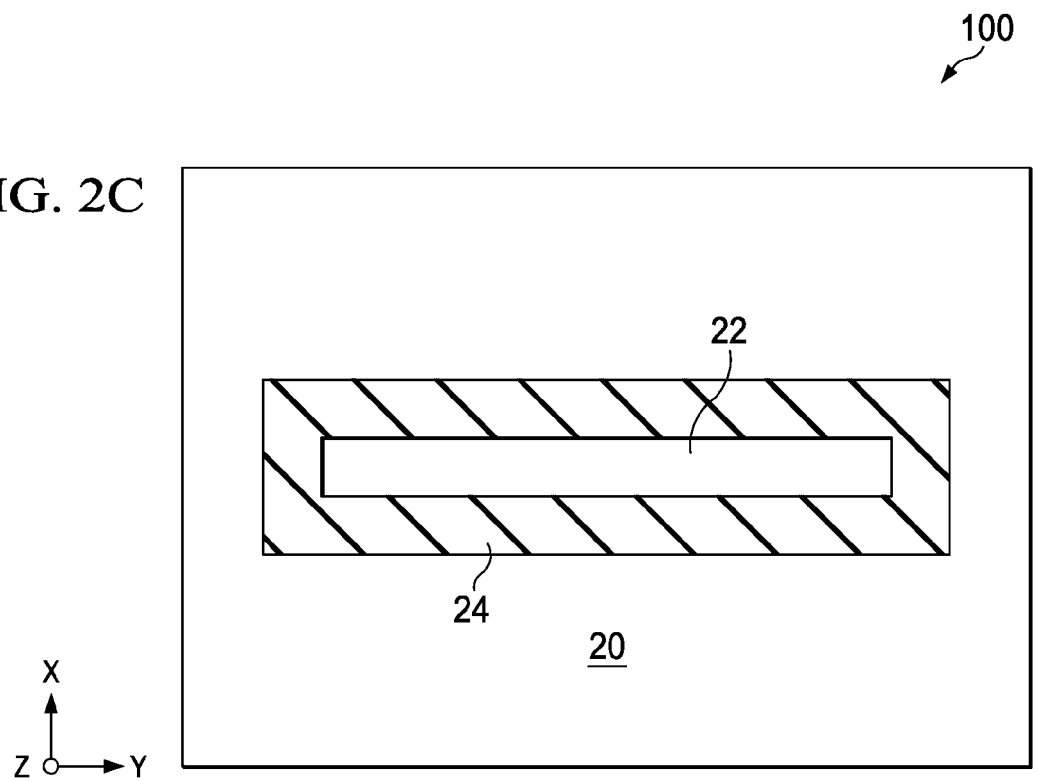

Next, referring to FIGS. 2A, 2B, and 2C, epitaxy layer 24 is formed using an epitaxy step. The formation of epitaxy layer 24 may include a blanket epitaxy, so that epitaxy layer 24 is grown on the exposed surfaces of substrate 20. Epitaxy layer 24 includes a portion inside trench 22 and portions outside trench 22. A Chemical Mechanical Polish (CMP) is then performed to remove the portions of epitaxy layer 24 outside trench 22, while the portion of epitaxy layer 24 inside trench 22 remains. The top edge of the remaining portion of epitaxy layer 24 is thus level with the top surface of substrate 20. The epitaxy may be conformal, so that the sidewall portions of epitaxy layer 24 (on sidewalls of trench 22) and the bottom portion of epitaxy layer 24 have substantially the same thickness T1. In some exemplary embodiments, thickness T1 is between about 4 nm and about 20 nm. After the formation of epitaxy layer 24, the remaining trench 22 may have depth D2 between about 4 nm and about 20 nm.

Epitaxy layer 24 may be formed of a first semiconductor material. In some embodiments, epitaxy layer 24 comprises $Si_xGe_{1-x}$, wherein X is greater than 0 and smaller than 1, and may be, for example, between about 0.7 and 0.9. In alternative embodiments, epitaxy layer 24 is a semiconductor layer doped with an impurity having a first doping concentration. For example, epitaxy layer 24 may be a silicon layer doped with arsenic, phosphorous, boron, gallium, indium, antimony, oxygen, nitrogen, or combinations thereof. The first doping concentration may be, for example, between about $1 \times 10^{19}$ /cm$^3$ and about $8 \times 10^{19}$ /cm$^3$.

Figure 3A:
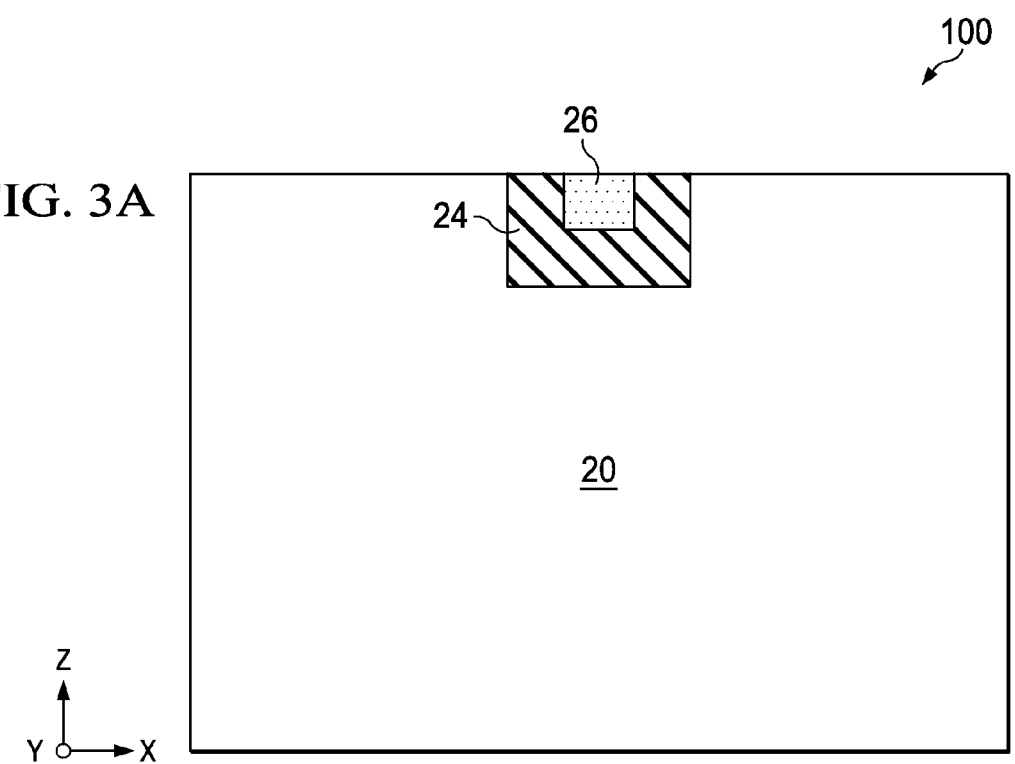
Figure 3B:
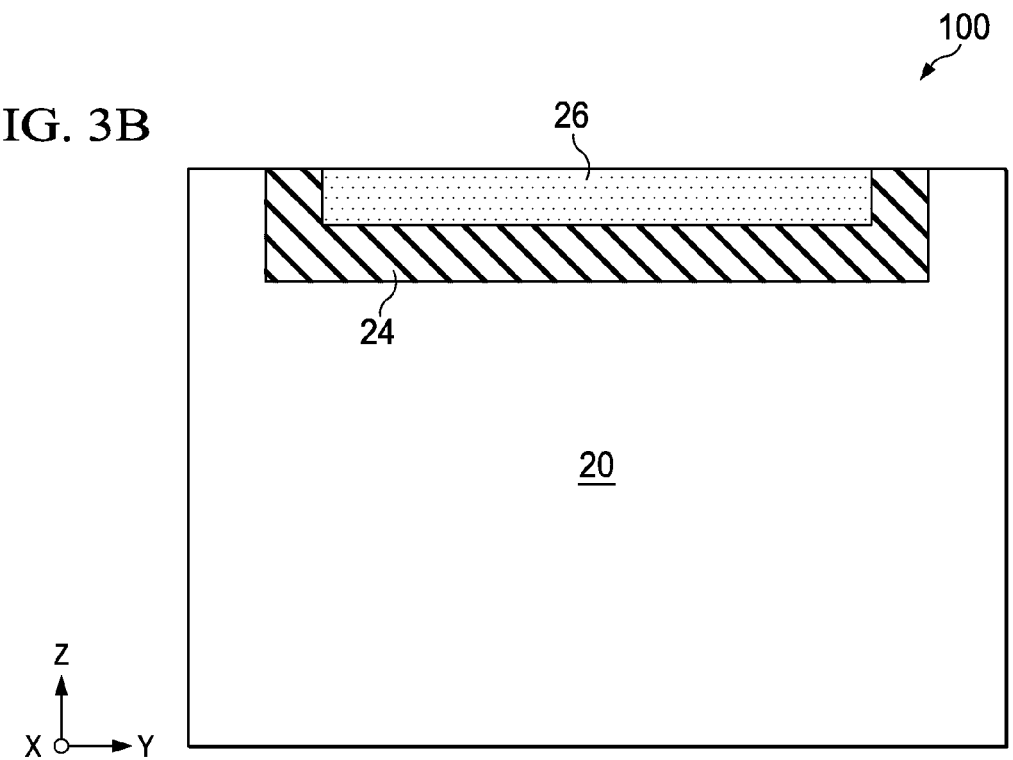
Figure 3C:
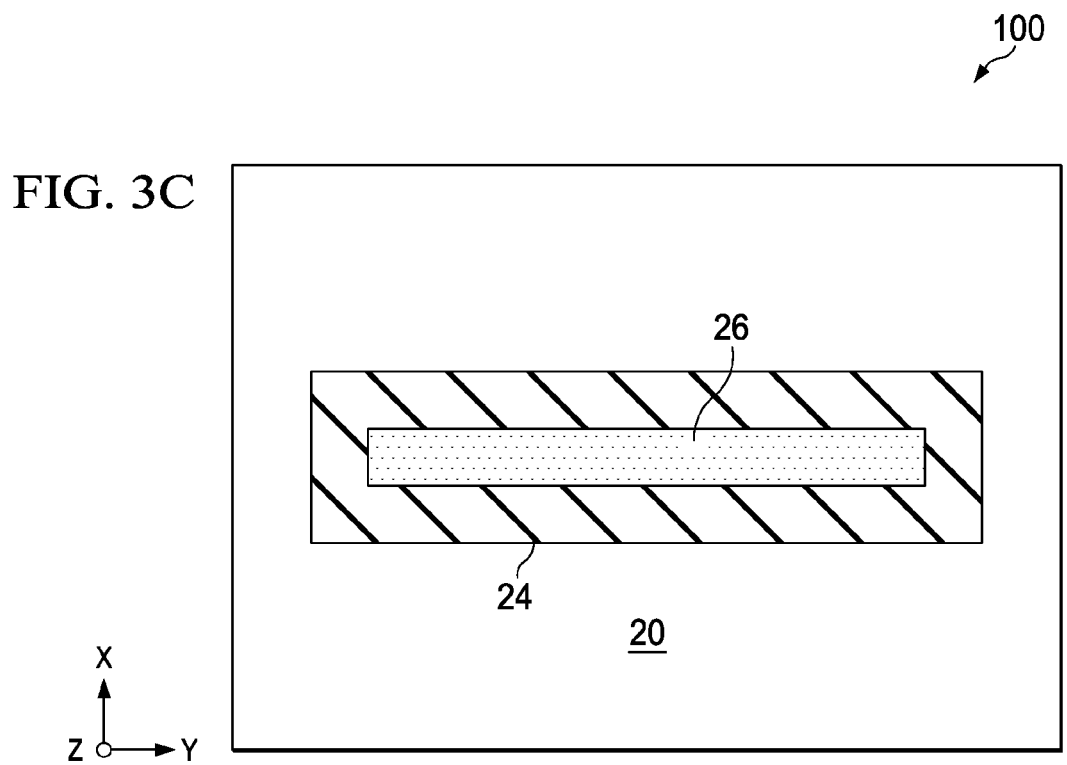

Next, as shown in FIGS. 3A, 3B, and 3C, epitaxy layer 26 is formed using an epitaxy step, followed by a CMP. The resulting epitaxy layer 26 fills the entirety of remaining trench 22, with the top surfaces of epitaxy layer 24 and 26 level with the top surface of substrate 20. Epitaxy layer 26 is formed of a second material that differs from the first semiconductor material of epitaxy layer 24, with the difference significant enough, so that in subsequent steps, epitaxy layer 26 may be selectively etched, and epitaxy layer 24 remains. Epitaxy layer 26 may be a semiconductor layer. In some embodiments, for example, when epitaxy layer 24 comprises $Si_xGe_{1-x}$, epitaxy layer 24 may comprise $Si_yGe_{1-y}$, wherein value Y is greater than 0 and smaller than 1, and is different from value X. For example, value Y may be between about 0.4 and 0.9. In alternative embodiments wherein epitaxy layer 24 is a semiconductor layer doped with an impurity having the first doping concentration, epitaxy layer 26 may also be doped with the same impurity (or different impurities) to a second doping concentration different from the first doping concentration. For example, epitaxy layer 26 may be a silicon layer doped with arsenic, phosphorous, boron, gallium, indium, antimony, oxygen, nitrogen, or combinations thereof. The second doping concentration may be, for example, between about $8\times10^{19}/cm^3$ and about $8\times10^{20}/cm^3$, wherein a ratio of the second doping concentration to the first doping concentration may be greater than about 2, greater than about 5, or greater than about 10.

As shown in FIGS. 3A, 3B, and 3C, epitaxy layer 24 forms a tub, which is located in substrate 20. Epitaxy layer 26 is located in the tub. Epitaxy layer 26 is also surrounded by portions of epitaxy layer 24.

Figure 4A:
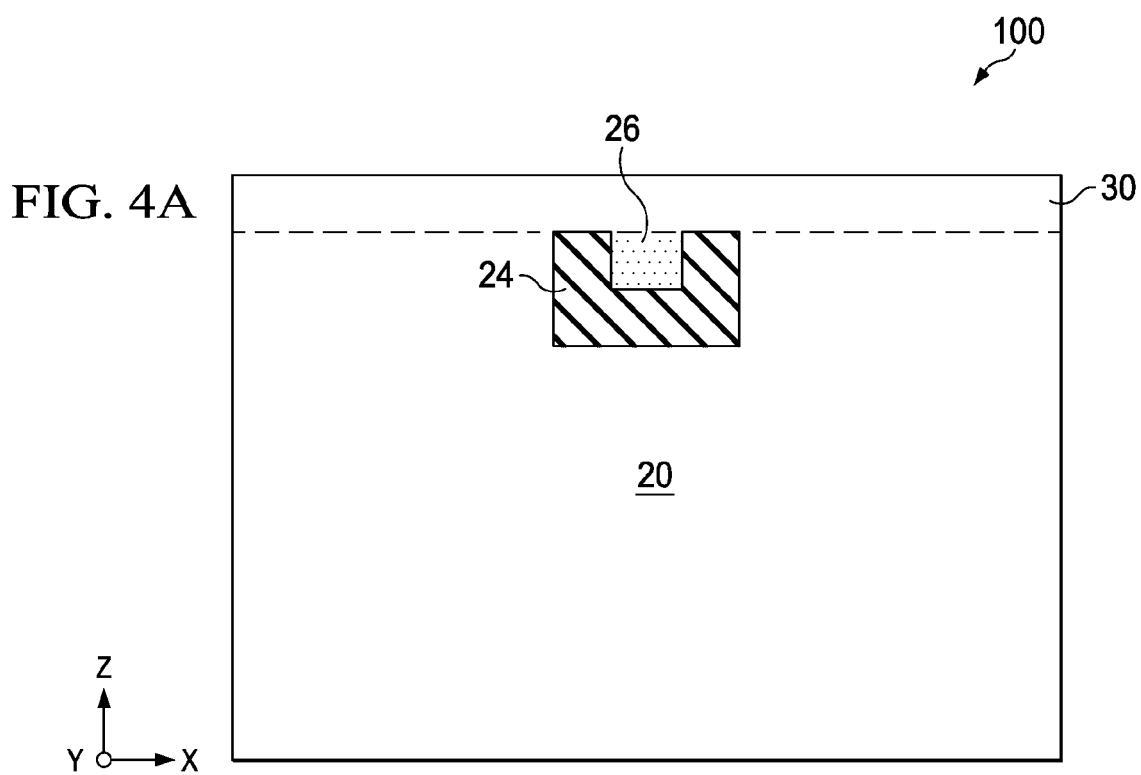

FIGS. 4A, 4B, and 4C illustrate the formation of semiconductor layer 30 through epitaxy. In some embodiments, semiconductor layer 30 comprises a material selected from silicon, germanium, a III-V compound semiconductor material, and combinations thereof. Semiconductor layer 30 may also comprise silicon, and may be substantially free from germanium. Semiconductor layer 30 may be undoped, although it may also be lightly doped, with n-type and p-type impurities. After the epitaxy, a further CMP may be performed to planarize the top surface of semiconductor layer 30. In some embodiments, thickness T2 of semiconductor layer 30 may be between about 5 nm and about 40 nm.

Referring to FIGS. 5A, 5B, and 5C, trenches 32 are formed in substrate 20 and epitaxy layers 24, 26, and 30. The lengthwise directions of trenches 32 may be in the X direction, which is perpendicular to the lengthwise direction (Y direction) of epitaxy layers 24 and 26. Accordingly, trenches 32 separate epitaxy layers 24 and 26 into a plurality of discrete portions, with each portion including one piece of layer 30, one piece of epitaxy layer 26, and the respective piece of epitaxy layer 24 underlying and on sidewalls of the piece of epitaxy layer 26. The cross-sectional view in FIG. 5A may be obtained from the plane crossing lines 5A-5A in FIGS. 5B and 5C. Furthermore, the cross-sectional view in FIG. 5B may be obtained from the plane crossing lines 5B-5B in FIG. 5C.

Trenches 32 have bottom surfaces 32A (FIG. 5B) lower than the bottom surfaces 24A of epitaxy layer 24. In some exemplary embodiments, width W2 (FIGS. 5B and 5C) of epitaxy pieces 24 and 26 may be between about 10 nm and about 60 nm. In FIG. 5C, epitaxy layer 24 is illustrated using dashed lines to mark it position, wherein the dashed lines indicate that epitaxy layer 24 is under semiconductor layer 30. Furthermore, FIG. 5C illustrates that semiconductor layer 30 are patterned into a plurality of semiconductor strips 30A, and bulk semiconductor regions 30B and 30C on opposite sides of, and connected to, semiconductor strips 30A.

Referring to FIGS. 6A, 6B, and 6C, a dielectric material is filled into the bottom portions of trenches 32 to form insulation regions 36. Insulation regions 36 may be Shallow Trench Isolation (STI) regions, and hence are referred to as STI regions 36 hereinafter. The formation of STI regions 36 may be performed by filling a reflowable oxide into trenches 32, and curing the reflowable oxide. In some embodiments, as illustrated in FIG. 6B, the top surfaces 36A of STI regions 36 are substantially level with bottom surface 24A of epitaxy layer 24. In alternative embodiments, the top surfaces of STI regions 36 may be at the level shown as 36A', which is substantially level with top surface 24B (also refer to FIG. 6A) of the bottom portion of epitaxy layer 24. In yet alternative embodiments, the top surfaces of STI regions 36 may be at any level between levels 36A and 36A'.

Figure 7A:
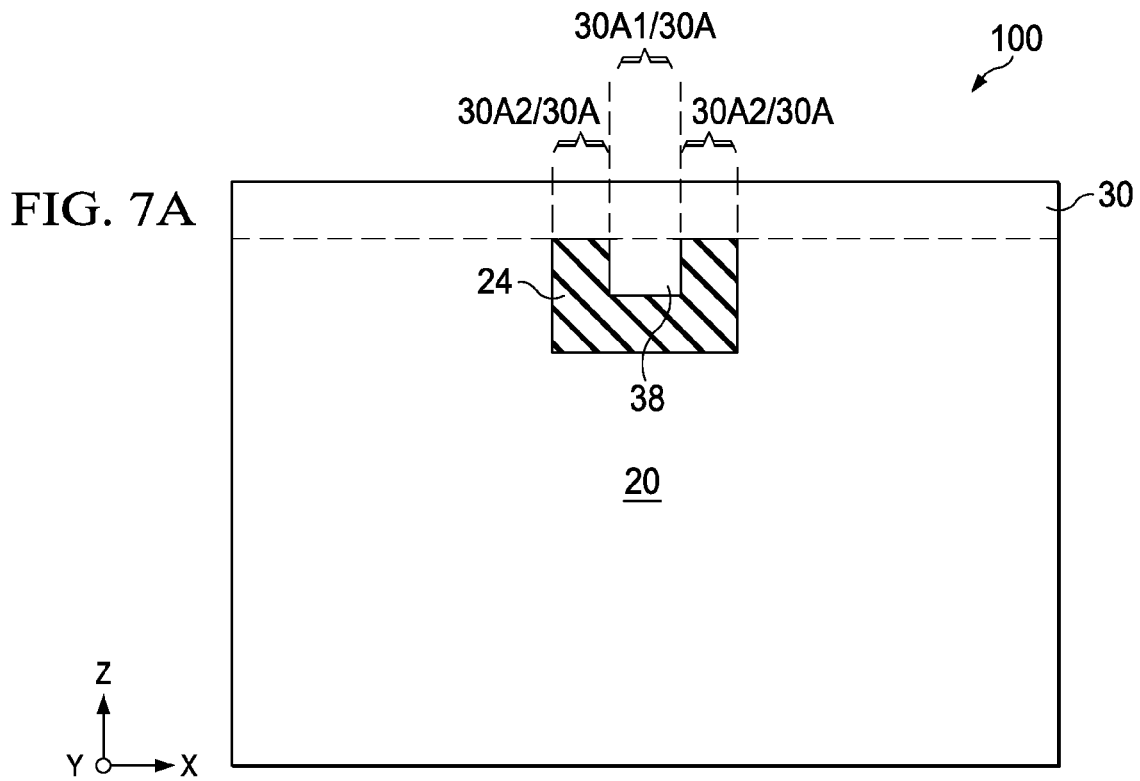
Figure 7B:
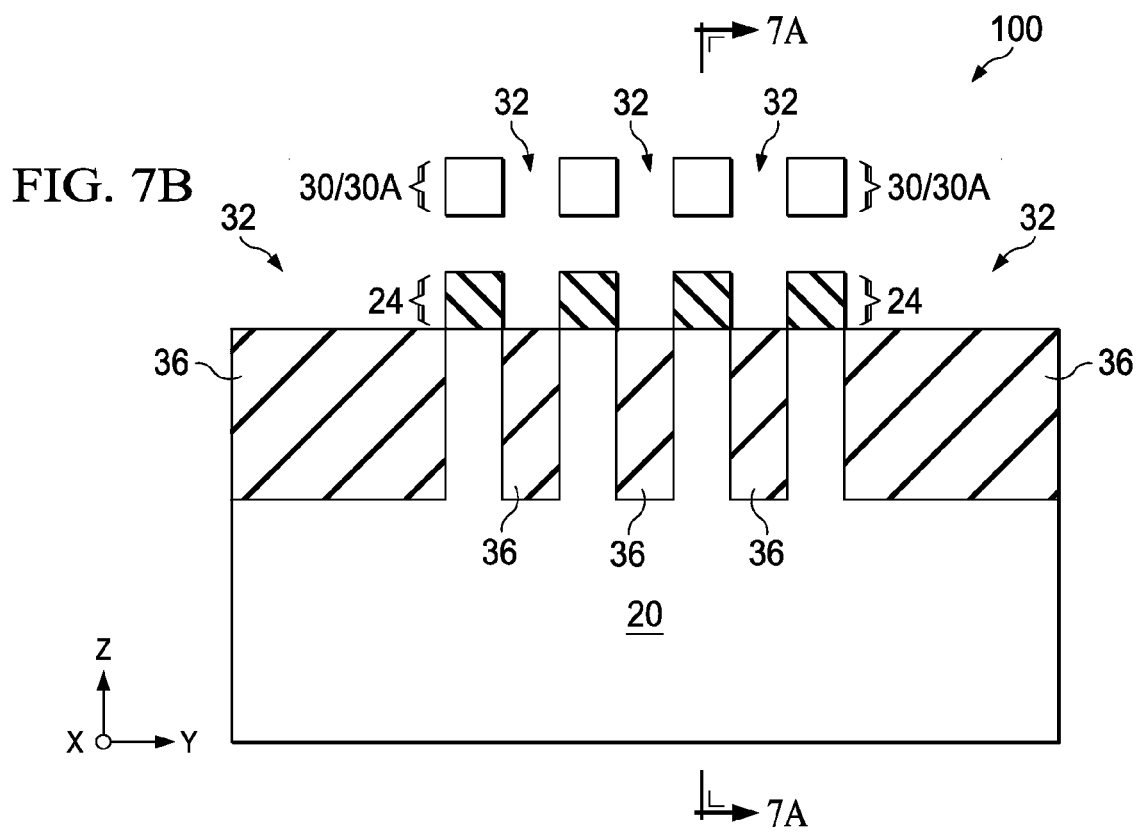

As shown in FIG. 6B, the remaining portions of epitaxy layer 24 may be accessed through trenches 32. The remaining portions of epitaxy layer 24 are selectively etched, and epitaxy layer 26, substrate 20, semiconductor layer 30, and STI regions 36 are not etched. The resulting structure is shown in FIGS. 7A, 7B, and 7C. The cross-sectional view in FIG. 7A may be obtained from the plane crossing lines 7A-7A in FIGS. 7B and 7C. Furthermore, the cross-sectional view in FIG. 7B may be obtained from the plane crossing lines 7B-7B in FIG. 7C. The etchant used for the etching is selected according to the materials of epitaxy layer 26, substrate 20, and semiconductor layer 30. In accordance with some embodiments, with either different percentages of silicon and germanium in epitaxy layers 24 and 26, or different doping concentrations in epitaxy layers 24 and 26, an appropriate etchant may be selected to have an adequate etching selectivity for epitaxy layer 26. For example, with epitaxy layer 26 comprising SiGe with different germanium percentages, $NH_4OH:H_2O_2$ and $H_2O_2$, $HF:H_2O_2:CH_3COOH$, or Tetramethylammonium hydroxide (TMAH)-based solutions may be used as the etchant.

As shown in FIGS. 7A and 7B, after the etching of epitaxy layer 26, cavities 38 are formed as a result of the removal of epitaxy layer portions 26. Each discrete portion of epitaxy layer 24 has sidewall portions on opposite sides of the respective cavities 38, and a bottom portion under the respective cavities 38. Cavity 38 is located between the sidewall portions of epitaxy layer 24.

As shown in FIG. 7B, cavities 38 may be accessed through trenches 32. FIG. 7A illustrates that semiconductor strip 30A include portion 30A1 suspended over cavity 38, and portions 30A2 supported by the sidewall portions of epitaxy layer 24. The suspended portion 30A1 of semiconductor strip 30A is supported by portions 30A2.

Figure 8B:
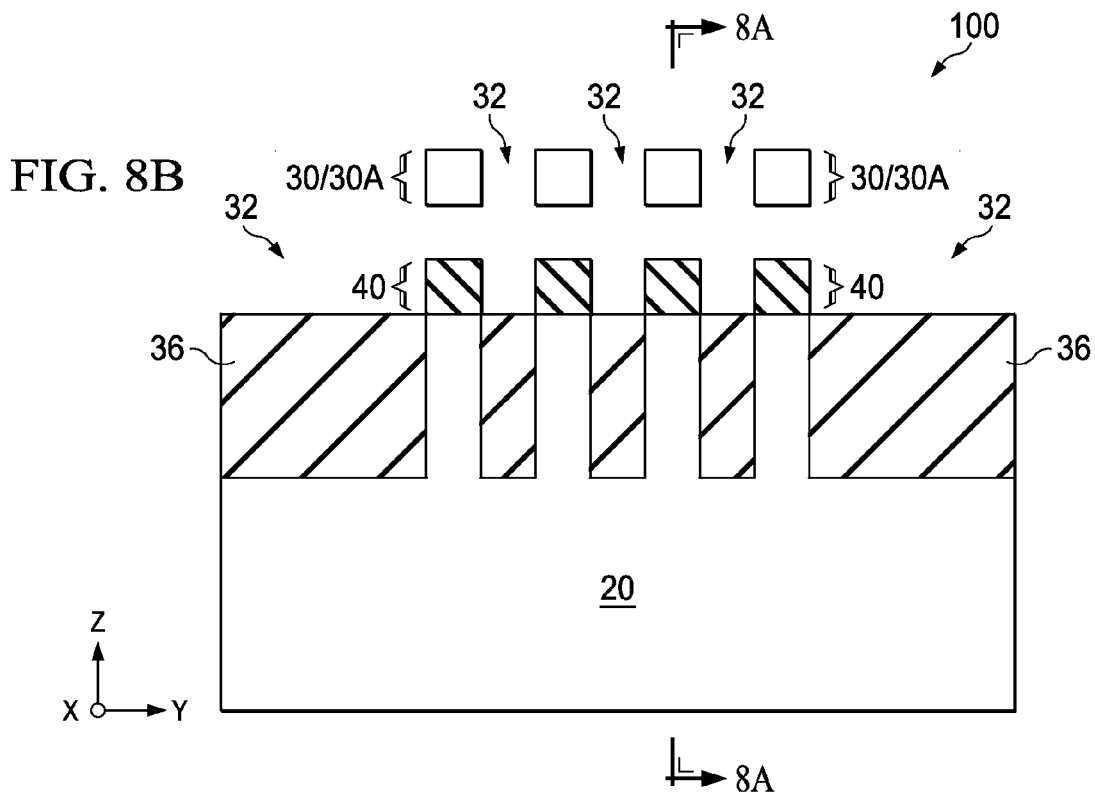
Figure 8C:
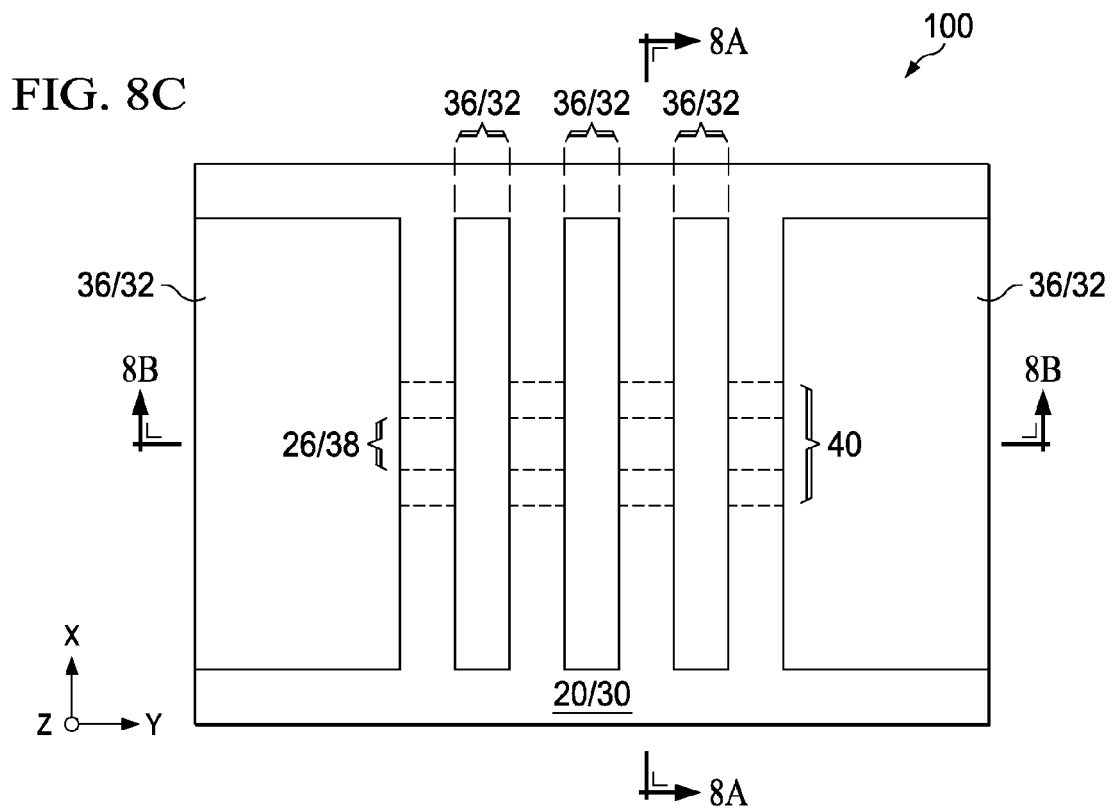

Next, epitaxy layer 24 is selectively oxidized, for example, in a thermal oxidation process performed in an oxygen-containing environment. The resulting structure is shown in FIGS. 8A, 8B, and 8C, wherein oxide regions 40 are formed as a result of the selective oxidation of epitaxy layer 24. Oxide regions 40 are also oxide strips. The cross-sectional view in FIG. 8A may be obtained from the plane crossing lines 8A-8A in FIGS. 8B and 8C.

Furthermore, the cross-sectional view in FIG. 8B may be obtained from the plane crossing lines 8B-8B in FIG. 8C. Depending on the composition of epitaxy layer 24, oxide regions 40 may comprise a silicon oxide, a silicon germanium oxide, or the like. Due to the composition difference between semiconductor layer 30 and epitaxy layer 24, the oxidation rate of epitaxy layer 24 is significantly greater than the oxidation rate of semiconductor layer 30. In one embodiment, the difference in oxidation rates is due to the difference in doping concentrations in semiconductor layer 30 and epitaxy layer 24. For example, when epitaxy layer 24 is formed of SiGe, the oxidation rate of epitaxy layer 24 may be 7 to 30 times the oxidation rate of the silicon-based (free from germanium) semiconductor layer 30. Epitaxy layer 24 may be oxidized entirely. As a comparison, a thin surface layer of semiconductor layer 30 that is exposed is oxidized, and the inner portion of semiconductor layer 30 remains not oxidized. The resulting oxide layer of semiconductor layer 30 is not shown, and may form portions of the gate oxide 42 in FIGS. 9A, 9B, and 9C.

Figure 9C:
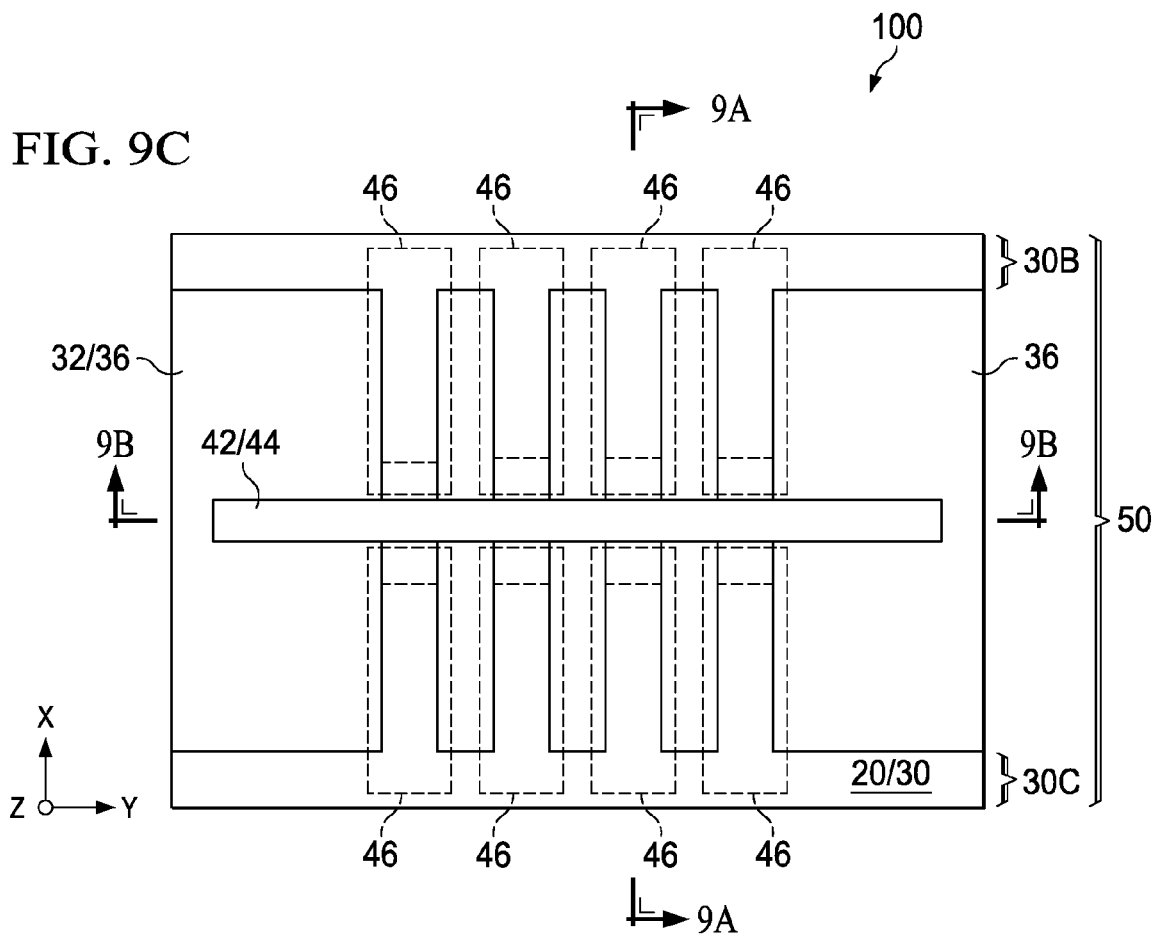

FIGS. 9A, 9B, and 9C illustrate the formation of gate dielectric 42, and gate electrode 44 on gate dielectric 42. The cross-sectional view in FIG. 9A may be obtained from the plane crossing lines 9A-9A in FIGS. 9B and 9C. Furthermore, the cross-sectional view in FIG. 9B may be obtained from the plane crossing lines 9B-9B in FIG. 9C. The formation of gate dielectric 42 and gate electrode 44 may include forming a blanket gate dielectric layer using a conformation method, forming a blanket gate electrode using a conformal method, and patterning the gate dielectric layer. Gate dielectric 42 may include a thin oxide layer, which may be formed as the result of the oxidation step in FIGS. 8A, 8B, and 8C. Gate dielectric 42 may further include a high-k dielectric layer(s) that is formed of a high-k dielectric material such as hafnium oxide, zirconium oxide, or the like. Other oxides and/or nitrides of Hf, Al, La, Lu, Zr, Ti, Ta, Ba, Sr, Pb, and/or the like, may also be used in gate dielectric 42. Gate electrode 44 may include Ti, Ta, W, Mo, Ru, Pt, Co, Ni, Pd, Nb, or alloys thereof or compound metals such as TiN, TaC, or TaN.

At the same time gate dielectric 42 is formed, dielectric layer 48 is also formed simultaneously, and hence is formed of a same material as gate dielectric 42. As shown in FIG. 9B, dielectric layer 48 may have sidewall portions on sidewalls of oxide regions 40, and a top portion on the top surface of oxide regions 40.

As shown in FIG. 9B, gate dielectric 42 wraps around the suspended semiconductor strips 30A1, and gate electrode 44 wraps around gate dielectric 42. The suspended semiconductor strips 30A1 thus form the channels of the respective MOSFET. As shown in FIG. 9A, the patterned gate dielectric 42 and gate electrode 44 may be substantially aligned to cavity 38 (FIG. 8A), with the edges of gate dielectric 42 and gate electrode 44 substantially aligned to the sidewalls of the respective cavity 38. As shown in FIG. 9C, source and drain regions 46 may be formed on opposite sides of gate electrode 44, for example, by implanting the portions of semiconductor strips 30A (and possibly semiconductor portions 30B and 30C that are not covered by gate electrode 44. The sources in the plurality of semiconductor strips 30 may be interconnected to form a source region, and the drains in the plurality of semiconductor strips 30 may be interconnected to form a drain region. MOSFET 50 is thus formed.

As shown in FIG. 9A, each of oxide regions 40 (which are also dielectric regions) comprises a bottom portion, and sidewall portions over and connected to opposite ends of the bottom portion. Gate electrode 44 comprises an in-tub portion 44A between opposite sidewall portions of oxide region 40. Furthermore, gate dielectric 42 comprises a portion wrapping around the in-tub portion 44A of gate electrode 44.

Further referring to FIG. 9B, oxide regions 40 space gate electrode 44 apart from portion 20A of substrate 20, and space gate electrode 44 apart from source and drain regions 46 (FIG. 9C). The parasitic capacitance between gate electrode 44 and substrate 20, and the parasitic capacitance between gate electrode 44 and source and drain regions 46 are thus significantly reduced. Oxide regions 40 and dielectric layer 48 may comprise different dielectric materials. Furthermore, since epitaxy layer 24 (FIG. 7B) and substrate 20 may comprise different semiconductor materials, oxide regions 40 may comprise an oxide that is not the oxide of substrate 20 since oxide regions 40 are not formed by oxidizing substrate 20. As shown in FIG. 9B, oxide regions 40 may be substantially aligned to the respective semiconductor strips 30A, and aligned to the respective underlying semiconductor strips 20A.

In the embodiments, by forming wrapped-around gate electrodes 44 encircling wrapped-around gate dielectrics 42, MOSFET 50 may include a plurality of semiconductor strips 30A (FIG. 9B), with the channels of MOSFET 50 formed on the surface portions of semiconductor strips 30A. Each of semiconductor strips 30A includes four portions of channels arranged in parallel. The drive current of MOSFET 50 is thus increased by four. On the other hand, the formation of oxide regions 40 results in the reduction in parasitic capacitance.

In accordance with embodiments, a device includes a substrate, a semiconductor strip over the substrate, a gate dielectric wrapping around the semiconductor strip, and a gate electrode wrapping around the gate dielectric. A dielectric region is overlapped by the semiconductor strip. The semiconductor strip and the dielectric region are spaced apart from each other by a bottom portion of the gate dielectric and a bottom portion of the gate electrode.

In accordance with other embodiments, a device includes a semiconductor substrate, and a plurality of semiconductor strips over the semiconductor substrate. The plurality of semiconductor strips is parallel to each other and spaced apart from each other. A plurality of oxide strips is underlying and aligned to the plurality of semiconductor strips. A plurality of insulation regions is underlying and aligned to spaces between the plurality of semiconductor strips. A plurality of strips of the semiconductor substrate is underlying and aligned to the plurality of oxide strips, wherein the plurality of strips of the semiconductor substrate is spaced apart from each other by the plurality of insulation regions. The device further includes a plurality of gate dielectrics, each wrapping around one of the plurality of semiconductor strips, and a gate electrode wrapping around the plurality of gate dielectrics. The gate electrode and the plurality of gate dielectrics separate the plurality of semiconductor strips apart from the plurality of oxide strips.

In accordance with yet other embodiments, a method includes etching a semiconductor substrate to form a trench, performing a first epitaxy to form a first epitaxy strip at a bottom and on sidewalls of the trench, and performing a second epitaxy to form a second epitaxy strip over the first epitaxy strip and filling a remaining portion of the trench. Top edges of the first epitaxy strip are level with a top surface of the second epitaxy strip and a top surface of the semiconductor substrate. The method further includes performing a third epitaxy to form a third epitaxy layer over the first epitaxy strip and the second epitaxy strip, and forming trenches extending from a top surface of the third epitaxy layer into the second epitaxy strip, the first epitaxy strip, and the semiconductor substrate, wherein a remaining portion of each of the first epitaxy strip, the second epitaxy strip, and the third epitaxy layer is located between two of the trenches. The second epitaxy strip is selectively removed to form a cavity underlying a portion of the third epitaxy layer, wherein the first epitaxy strip and the third epitaxy layer remain after the step of selectively removing. The first epitaxy strip is selectively oxidized, wherein the third epitaxy layer remains after the step of selectively oxidizing.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
a substrate;
a semiconductor strip over the substrate, wherein the semiconductor strip comprises silicon and is substantially free from germanium;
a gate dielectric wrapping around the semiconductor strip;
a gate electrode wrapping around the gate dielectric; and
a dielectric region overlapped by the semiconductor strip, wherein the dielectric region comprises silicon germanium oxide, and wherein the semiconductor strip and the dielectric region are spaced apart from each other by a bottom portion of the gate dielectric and a bottom portion of the gate electrode.

2. The device of claim 1 further comprising:
a strip of the substrate, wherein the strip of the substrate is a semiconductor strip, and is overlapped by the dielectric region; and
shallow trench isolation regions on opposite sides of and contacting the strip of the substrate.

3. The device of claim 2, wherein edges of the dielectric region are substantially aligned to interfaces between the shallow trench isolation regions and the strip of the substrate.

4. The device of claim 1 further comprising a dielectric layer between the gate electrode and the dielectric region, wherein the dielectric layer is formed of a same material as the gate dielectric.

5. The device of claim 4, wherein the dielectric layer comprises a portion over a top surface of the dielectric region, and portions on sidewalls of the dielectric region.

6. The device of claim 1, wherein the dielectric region comprises a bottom portion, and sidewall portions over and connected to opposite ends of the bottom portion, and wherein the gate electrode comprises an in-tub portion between opposite sidewall portions of the dielectric region, and wherein the gate dielectric comprises a portion wrapping around the in-tub portion of the gate electrode.

7. A device comprising:
a semiconductor substrate;
a plurality of semiconductor strips over the semiconductor substrate, wherein the plurality of semiconductor strips is parallel to each other and spaced apart from each other;
a plurality of oxide strips underlying and aligned to the plurality of semiconductor strips;
a plurality of insulation regions underlying and aligned to spaces between the plurality of semiconductor strips;
a plurality of strips of the semiconductor substrate underlying and aligned to the plurality of oxide strips, wherein the plurality of strips of the semiconductor substrate is spaced apart from each other by the plurality of insulation regions;
a plurality of gate dielectrics, each wrapping around one of the plurality of semiconductor strips; and
a gate electrode wrapping around the plurality of gate dielectrics, wherein the gate electrode and the plurality of gate dielectrics separate the plurality of semiconductor strips apart from the plurality of oxide strips.

8. The device of claim 7 further comprising a plurality of source regions and a plurality of drain regions on opposite sides of, and connected to, the plurality of semiconductor strips.

9. The device of claim 7, wherein the plurality of oxide strips comprises top surfaces higher than top surfaces of the plurality of insulation regions.

10. The device of claim 7, wherein the plurality of oxide strips comprises silicon germanium oxide.

11. The device of claim 7, wherein each of the plurality of oxide strips comprises:
a bottom portion; and
sidewall portions connected to opposite ends of the bottom portion, wherein the gate dielectric and the gate electrode extend into a space between the sidewall portions of the each of the plurality of oxide strips.

12. The device of claim 7, wherein the plurality of oxide strips comprises an oxide different from an oxide that can be formed by oxidizing the semiconductor substrate or the plurality of semiconductor strips.

13. A device comprising:
a transistor comprising:
a sub-transistor comprising:
a U-shaped dielectric region comprising a horizontal portion and two vertical portions connected to opposite ends of the horizontal portion, with a space separating the two vertical portions from each other;
a semiconductor region overlapping the space;
a gate dielectric encircling the semiconductor region, wherein the gate dielectric comprises a first portion overlapping the semiconductor region, and a second portion underlying the semiconductor region and extending into the space, and wherein the gate dielectric extends on a top surface and opposite sidewalls of the U-shaped dielectric region; and
a gate electrode encircling the gate dielectric.

14. The device of claim 13, wherein the U-Shaped dielectric region comprises silicon germanium oxide.

15. The device of claim 13 further comprising:
Shallow Trench Isolation (STI) regions; and
a semiconductor substrate comprising a portion between opposite portions of the STI regions, wherein the space overlaps the portion of the semiconductor substrate.

16. The device of claim 13, wherein the gate electrode extends into the space.

17. The device of claim 16, wherein the second portion of the gate dielectric further encircles a portion of the gate electrode extending into the space.

18. The device of claim 13 further comprising:
a plurality of sub-transistor, each comprising:
an additional U-shaped dielectric region comprising an additional horizontal portion and two additional vertical portions connected to opposite ends of the additional horizontal portion, with an additional space separating the two additional vertical portions from each other;
an additional semiconductor region overlapping the additional space;
an additional gate dielectric encircling the additional semiconductor region, wherein the additional gate dielectric comprises a third portion overlapping the additional semiconductor region, and a fourth portion underlying the additional semiconductor region and extending into the additional space; and
an additional gate electrode encircling the additional gate dielectric; and a source/drain region connected to the semiconductor region of the sub-transistor and the additional semiconductor regions of the plurality of sub-transistors.

19. The device of claim 6 further comprising:

Shallow Trench Isolation (STI) regions, wherein the substrate comprises a portion between opposite portions of the STI regions, and the portion of the substrate is overlapped by the in-tub portion of the gate electrode.

20. The device of claim 6, wherein the sidewall portions of the dielectric region are higher than the bottom portion of the dielectric region.

* * * * *